(12) United States Patent
Khazaka

(10) Patent No.: US 9,865,530 B2
(45) Date of Patent: Jan. 9, 2018

(54) ASSEMBLY COMPRISING AN ELEMENT THAT IS CAPABLE OF TRANSMITTING HEAT, A FILM OF A POLYMER THAT IS A GOOD THERMAL CONDUCTOR AND ELECTRICAL INSULATOR, A SINTERED JOINT AND A RADIATOR AND MANUFACTURING METHOD

(71) Applicant: COMMISSARIAT A L'ENERGIE ATOMIQUE ET AUX ENERGIES ALTERNATIVES, Paris (FR)

(72) Inventor: Rabih Khazaka, La Tronche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/205,290

(22) Filed: Jul. 8, 2016

(65) Prior Publication Data

US 2017/0011991 A1    Jan. 12, 2017

(30) Foreign Application Priority Data

Jul. 10, 2015  (FR) ..................... 15 56560

(51) Int. Cl.
*H01L 23/495* (2006.01)
*B22F 1/00* (2006.01)
(Continued)

(52) U.S. Cl.
CPC ...... *H01L 23/49568* (2013.01); *B22F 1/0018* (2013.01); *B22F 1/0074* (2013.01); *B22F 3/1017* (2013.01); *B22F 7/064* (2013.01); *H01L 23/00* (2013.01); *H01L 23/3675* (2013.01); *H01L 23/3736* (2013.01); *H01L 23/49541* (2013.01); *H01L 24/32* (2013.01);
(Continued)

(58) Field of Classification Search
CPC ..... H01L 33/644; H01L 33/64; H01L 33/641; H01L 23/40; H01L 23/4012; H01L 2023/4037
See application file for complete search history.

(56) References Cited

U.S. PATENT DOCUMENTS 4,810,563 A    3/1989  Degree et al.
8,257,795 B2   9/2012  Lu et al.
(Continued)

FOREIGN PATENT DOCUMENTS

WO    2010/111581 A1   9/2010
WO    2015/005373 A1   1/2015

OTHER PUBLICATIONS

S. Joo et al., "Adhesion mechanisms of nanoparticle silver to substrate materials: identification," Nanotechnology 21 (2010), 055204, pp. 1-12.
(Continued)

*Primary Examiner* — Sonya D McCall Shepard
(74) *Attorney, Agent, or Firm* — Baker & Hostetler LLP

(57) ABSTRACT

An assembly comprises: at least one element that is capable of transmitting heat; at least one electrically insulating substrate comprising at least one film of a polymer that is a good thermal conductor and electrical insulator; at least one sintered metal joint that is in contact with the polymer film; a main radiator; the radiator being in direct contact, or in contact via a sintered joint, with the substrate.

28 Claims, 6 Drawing Sheets

(51) Int. Cl.
*B22F 3/10* (2006.01)
*B22F 7/06* (2006.01)
*H01L 23/367* (2006.01)
*H01L 23/373* (2006.01)
*H01L 23/00* (2006.01)

(52) U.S. Cl.
CPC ...... *H01L 24/83* (2013.01); *H01L 2224/2732* (2013.01); *H01L 2224/2919* (2013.01); *H01L 2224/29139* (2013.01); *H01L 2224/32245* (2013.01); *H01L 2224/8384* (2013.01); *H01L 2224/83192* (2013.01); *H01L 2924/0695* (2013.01); *H01L 2924/07025* (2013.01); *H01L 2924/10253* (2013.01)

(56) References Cited

U.S. PATENT DOCUMENTS

| | | |
|---|---|---|
| 2009/0162557 A1 | 6/2009 | Lu et al. |
| 2012/0153012 A1 | 6/2012 | Schaefer et al. |
| 2012/0243192 A1* | 9/2012 | Robert ............... H01L 23/3735 361/767 |
| 2014/0293552 A1* | 10/2014 | Bogen ................. H01L 23/293 361/728 |
| 2016/0219693 A1* | 7/2016 | Nishimoto .......... H01L 23/3735 |
| 2016/0268190 A1* | 9/2016 | McKnight-MacNeil H01L 23/49562 |

OTHER PUBLICATIONS

S. H. Yoon et al., "Sintering and Consolidation of Silver Nanoparticles Printed on Polyimide Substrate Films," Macromolecular Research (2009), vol. 17, No. 8, pp. 568-574.

\* cited by examiner ered to as a
ASSEMBLY COMPRISING AN ELEMENT THAT IS CAPABLE OF TRANSMITTING HEAT, A FILM OF A POLYMER THAT IS A GOOD THERMAL CONDUCTOR AND ELECTRICAL INSULATOR, A SINTERED JOINT AND A RADIATOR AND MANUFACTURING METHOD

CROSS-REFERENCE TO RELATED APPLICATIONS

This application claims priority to foreign French patent application No. FR 1556560, filed on Jul. 10, 2015, the disclosure of which is incorporated by reference in its entirety.

FIELD OF THE INVENTION

The field of the invention is that of electrically insulated metalized substrates with low thermal resistance that are integrated in assemblies intended, in particular, for power modules.

One of the target applications of the present invention relates to applications at high power densities and temperatures (higher than 200° C.) and allowing the insulating ceramic and thermal grease that are conventionally used to be omitted.

BACKGROUND

As shown in the exploded view in FIG. 1, power modules commonly comprise a semiconductor chip: element E that is capable of generating heat, an electrical insulator I (dielectric substrate) protecting the information inside said semiconductor chip and a cooling system SR that removes heat from the system via a heat exchanger R that is integral with the electrical insulator.

In general, it should be noted that in power electronics, only ceramic substrates mounted on a heat exchanger are currently proposed (for multichip modules that must ensure insulation between chips heat exchanger).

The insulating substrate has two main functions: it may bear the (mainly copper) conductive tracks and also ensure electrical insulation between the semiconductor chips and the cooling system.

An example of a stack frequently employed in the manufacture of power modules more specifically comprises the following components: the semiconductor component (heat source); the solder for mounting the semiconductor component on a substrate; the substrate, which is generally made of a ceramic between two metal plates and is manufactured using various techniques (direct-bonded copper: DBC; active metal brazing: AMB; direct-bonded aluminum: DBA) and allows interconnections (between semiconductors and with the outside) via the top metal tracks and mounting on a base via the bottom metal portion to be achieved. Another solder is also provided in order to mount the substrate on the base, which is generally made of copper Cu and whose role is to spread the thermal flux.

The assembly is then mounted on the radiator using thermal grease.

FIG. 2 diagrammatically shows such a known assembly and the thermal properties of the materials used are given below.

This example of an assembly illustrated in FIG. 1 highlights:

a main heat exchanger R, commonly referred to as a radiator, typically potentially having a thermal conductivity that is greater than 100 $W \cdot m^{-1} K^{-1}$ and potentially being made of copper;

a thermal grease Gth with a thickness of 200 µm and a thermal conductivity of the order of 2 $W \cdot m^{-1} \cdot K^{-1}$;

a mounted copper base M, for spreading heat and forming a secondary heat exchanger, with a thickness of 1000 µm;

a solder B1 of 50 µm and thermal conductivity of the order of 40 $W \cdot m^{-1} K^{-1}$;

an insulating substrate I of DBC (direct-bonded copper) type composed of a ceramic plate made of $Al_2O_3$ comprising, on its two faces, layers of copper with a thickness that is equal to 300 µm and with a thermal conductivity that is equal to 400 $W \cdot m^{-1} K^{-1}$, the ceramic plate having a thickness that is typically of 600 µm and a thermal conductivity that is equal to 20 $W \cdot m^{-1} K^{-1}$ (in the case of $Al_2O_3$);

a second solder B2 with a thickness that is equal to 50 µm and a thermal conductivity of the order of 40 $W \cdot m^{-1} K^{-1}$;

a silicon chip E with a thermal conductivity that is equal to 100 $W \cdot m^{-1} K^{-1}$.

This stack has multiple limitations with respect to those applications referred to as "high temperature" applications (a "high temperature" may be due to a high ambient temperature or to the high power density dissipated in the semiconductors) and, in particular, the following drawbacks:

a high thermal resistance initially due to the ceramic, the thermal grease and the nine interfaces between the semiconductor and the cooling fluid that blocks the dissipation of heat and limits the power density of the semiconductors;

poor stability at high temperatures, limited by the operating temperature of the thermal grease and the solders;

limited thermomechanical reliability due to cracking of the ceramic (AlN and $Al_2O_3$), cracking in the solder and bowing of the substrate due to asymmetrical thermomechanical stresses imposed by the structure (etched top and full-wafer bottom metal tracks) subsequent to thermal cycle testing.

The use of a metal nanoparticle paste to thermally, mechanically and electrically connect the semiconductor to a substrate has already been described, in particular in U.S. Pat. No. 8,257,795. This replaces the solder between the chip and the metal of the substrate with a sintered silver joint that allows operation at high temperatures and the electrical and thermal properties of the joint to be improved. However, the invention described in this patent does not allow the problems caused by the presence of the ceramic and the presence of the thermal grease to be eliminated.

The adhesion mechanisms between the silver nanoparticle paste and metal and insulating substrates (ceramics and polymers) have also been described in the publication: Nanotechnology 21 (2010), "Adhesion mechanisms of nanoparticle silver to substrate materials: identification". A thin layer of 2 µm is deposited, then sintered, on polymer (Teflon® and Kapton®) films, subsequent to debonding tests using adhesive tape to assess the adhesion at the interface. The tests are limited to this step, without considering more advanced structures, and relate to very thin layers that are not compatible with power electronics.

The direct printing of a silver nanoparticle paste (with a thickness of less than 2 µm) carried out and sintered at various temperatures on polyimide substrates in order to produce electronic circuits is also known and is described in the article "Sintering and consolidation of silver nanoparticles printed on polyimide substrate films", published in Macromolecular research 17 (2008). The silver paste on polymer sintering tests are limited to that level.

SUMMARY OF THE INVENTION

In this context, the applicant has sought a solution integrating a substrate allowing the aforementioned drawbacks, and in particular those due to the need to use, during the assembly of a power semiconductor component, a thermal grease, a DBC-type ceramic substrate and a main heat exchanger, to be overcome, allowing heat generated during operation to be removed. The solution of the present invention thus relates to assemblies using organic insulators that are easy to mount on heat exchangers and are suitable for power module applications, in particular by virtue of the presence of a sintered joint and at least one film of a polymer that is a good thermal conductor and electrical insulator.

More generally, the present invention is also able to address the issue of assemblies comprising thick multilayer metal structures that it is desired to join together and that are capable of conveying current and heat while ensuring electrical insulation between the metal tracks, for which assemblies the solution proposed in the present invention includes the presence of (a) sintered joint(s) associated with one or more films of a polymer that is a good thermal conductor and electrical insulator.

More specifically, a subject of the present invention is an assembly comprising:
  at least one element that is capable of transmitting heat;
  at least one electrically insulating substrate comprising at least one film of a polymer that is a good thermal conductor and electrical insulator;
  at least one sintered metal joint that is in contact with said polymer film;
  a main radiator;
  said main radiator being in direct contact, or in contact via a sintered joint, with said substrate.

According to certain variants of the invention, the element that is capable of transmitting heat is a semiconductor component.

According to certain variants of the invention, the element that is capable of transmitting heat is a silicon chip.

According to certain variants of the invention, the element that is capable of transmitting heat is a thick metal structure whose thickness may typically be greater than about several tens of microns.

According to certain variants of the invention, said sintered joint is discontinuous.

According to certain variants of the invention, the assembly comprises metal tracks that are at least partly formed by said discontinuous sintered joint, the element that is capable of transmitting heat being connected to said discontinuous sintered joint via another sintered metal joint.

According to certain variants of the invention, the assembly comprises an intermediate element with high thermal conductivity, which may be metal, in contact with said joint, allowing a lateral distribution of the thermal flux that may be generated, in a plane that is parallel to the plane of said substrate.

According to certain variants of the invention, the intermediate element with high thermal conductivity is inserted between a first joint and a second joint, said second joint being in contact with said element that is capable of giving off heat.

According to certain variants of the invention, said intermediate element comprises a set of metal tracks.

According to certain variants of the invention, said intermediate element is an element belonging to a lead frame.

According to certain variants of the invention, the first and/or second joints are metal joints that may be made of silver.

According to certain variants of the invention, the thermally conductive and electrically insulating polymer is a polyimide, a polyamide or a polyamide-imide.

According to certain variants of the invention, the thermally conductive and electrically insulating polymer is filled with particles that may be dielectric particles (made of alumina or boron nitride) or metal particles.

According to certain variants of the invention, the assembly comprises at least one thermally conductive and electrically insulating polymer film on the surface of said radiator or on the surface of said sintered joint.

According to certain variants of the invention, the element that is capable of transmitting heat is a thick metal structure, the radiator being a thick metal structure, said metal structures potentially having thicknesses that are typically greater than about several tens of microns.

According to certain variants of the invention, the assembly comprises a stack comprising:
  at least a first thick metal structure;
  at least a first sintered joint;
  at least one polymer film;
  at least a second sintered joint;
  at least a second thick metal structure.

According to certain variants of the invention, the radiator is a thick structure that may be made of copper, aluminum or AlSiC, the thickness of said thick structure typically potentially being greater than about 500 µm.

Another subject of the invention is a method for manufacturing an assembly comprising:
  an element that is capable of transmitting heat;
  an electrically insulating substrate comprising at least one film of a polymer that is a good thermal conductor and electrical insulator;
  at least one main radiator;
  said main radiator being in direct contact, or in contact via a sintered joint, with said substrate,
said method comprising the production of a sintered metal joint in contact with said film of a polymer that is a good thermal conductor and electrical insulator.

According to certain variants of the invention, the method comprises the production of a sintered metal joint between a thermally conductive and electrically insulating dry polymer film and said radiator.

According to certain variants of the invention, the method comprises the deposition of a thermally conductive and electrically insulating polymer resin on the surface of said radiator, followed by a step of drying said resin.

According to certain variants of the invention, the method comprises the following steps:
  the deposition of at least a first paste or a first dry film of metal micro- or nanoparticles, which paste or dry film is intended to form a metal joint on the surface of said film of a polymer that is a good thermal conductor and electrical insulator;
  the deposition of said element that is capable of transmitting heat on top of said first paste or said first dry film of metal micro- or nanoparticles;
  a sintering operation so as to form a first sintered joint making the connection between said element that is capable of transmitting heat and said substrate.

According to certain variants of the invention, the deposition of the first paste is carried out via screen printing.

According to certain variants of the invention, the method comprises:

the introduction of an intermediate element with high thermal conductivity onto the surface of said first paste or said first film;

the production of a second joint between said intermediate element and said element that is capable of giving off heat.

According to certain variants of the invention, the method comprises:

the deposition of a second paste or a second dry film of metal micro- or nanoparticles on the surface of said intermediate element, which paste or dry film is intended to form a second joint;

the deposition of said element that is capable of giving off heat on the surface of said second paste or said dry film;

one or more sintering operation(s) so as to form a first sintered joint and a second sintered joint making the connection between said element that is capable of giving off heat and said substrate.

According to certain variants of the invention, the introduction of an intermediate element with high thermal conductivity to the surface of said first paste or said first dry film of metal micro- or nanoparticles comprises the attachment of metal tracks to said thermally conductive and electrically insulating polymer film, on top of said first paste or said first dry film of metal micro- or nanoparticles.

According to certain variants of the invention, the method comprises the mounting of a lead frame comprising said intermediate element with high thermal conductivity on the surface of said first paste or said first dry film of metal micro- or nanoparticles allowing the introduction of said intermediate element with high thermal conductivity.

According to certain variants of the invention, the method comprises a step of drying said first paste or said first paste and said second paste before the sintering operation.

According to certain variants of the invention, the method comprises the production of metal tracks that are at least partly formed by a sintered metal joint, the element that is capable of transmitting heat being connected to said discontinuous sintered metal joint via another sintered metal joint.

BRIEF DESCRIPTION OF THE DRAWINGS

The invention will be better understood and other advantages will become apparent on reading the following description, which is given by way of non-limiting example, and by virtue of the appended figures in which.

DETAILED DESCRIPTION

In general, the assembly of the present invention comprises an element that is capable of giving off heat, and may, in particular, be a semiconductor chip used for power electronics applications, a sintered joint and an organic substrate comprising at least one film of a polymer that is a good thermal conductor and electrical insulator and a radiator allowing heat generated over the course of operation to be optimally removed.

The polymer film may be obtained from a resin. It is also possible to use a polymerized film allowing the bottom face connections to be made in the same way as those of the top face (via sintering operations which will be described in more detail below).

The radiator may be a copper radiator as described below, but may also be composed of alloys or of colaminates.

Figure 3:
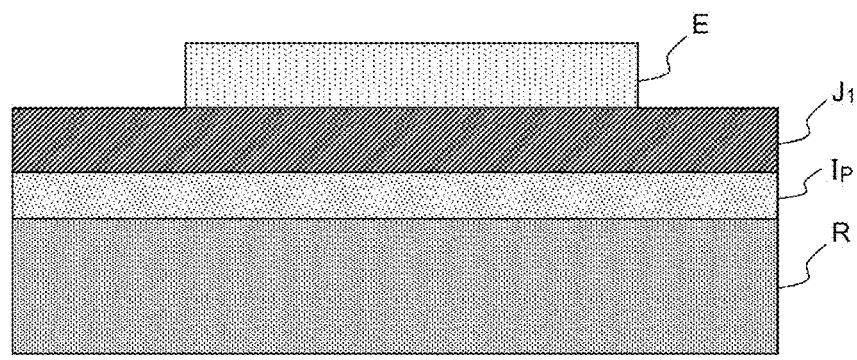
FIG. 3 illustrates a first example of an assembly according to the invention.

According to a first variant of the invention, illustrated in FIG. 3, the assembly may comprise:

a radiator R that may be a bulk structure which is a good conductor of heat;

a thermally conductive and electrically insulating polymer film $I_F$;

a sintered joint J1;

an element E that is capable of giving off heat, which may typically be a semiconductor component such as a silicon chip in contact with the joint J1 and potentially having a thermal conductivity that is equal to 100 $W \cdot m^{-1} K^{-1}$.

Typically, the polymer may be a polyimide that is advantageously filled with particles, with a thickness of 20 µm and a thermal conductivity that is equal to 1 $W \cdot m^{-1} \cdot K^{-1}$. The filled polyimide may be used as an insulator due to its good dielectric properties, its good thermal stability and its thermal conductivity, which is five times higher than that of an unfilled polyimide. It should be noted that other polymers may be used instead of polyimide (e.g. polyamide, polyamide-imide, etc.).

The deposition technique used may be screen printing, owing to its simplicity and good control of the thickness of the insulator. However, other polymer deposition techniques, such as spin coating, inkjet printing, vapor phase deposition, electrodeposition, etc., may also be used. The adhesion of the polyimide to the carrier carrying out a heat exchange function may be improved by using adhesion promoters or by carrying out specific surface treatments (e.g. using argon plasma) on said heat exchanger before depositing the polyimide resin.

Typically, the joint J1 may be made of silver, with a thickness of 20 µm and a thermal conductivity that is equal to 200 $W \cdot m^{-1} K^{-1}$.

A sintered joint may advantageously be produced by depositing a paste followed by a sintering operation. More specifically, in order to do this, a nanoparticle paste may be employed, followed by a drying operation. It is also possible to use a dry film of silver nanoparticles, which allows the step of drying the paste to be omitted.

Compared to a conventional solder or to a conductive adhesive, sintering silver nanoparticles has multiple advantages:

better thermal conductivity (more than four times higher than conventional solders);

a process temperature of less than 300° C. and an operating temperature of more than 300° C. (in the case of solder, the process temperature is higher than the operating temperature).

Moreover, the porous sintered joint allows the mechanical stresses induced by the difference in thermal expansion coefficient EC between the polymer and the metal during thermal cycles to be better tolerated.

The new structure thus allows the thermal limits of solders and thermal grease to be exceeded, along with the thermomechanical limits of ceramic substrates and soldered joints over large areas.

In this first variant of the invention, the number of thermal interfaces is highly limited and is equal to four. The electrical circuit is ensured by the sintered nanoparticle paste that is deposited via screen-printing. However, despite the reduction in thermal resistance in 1D, this structure does not allow the heat flux to be spread and also limits the currents flowing through the sintered tracks (due to the low thickness of the joint).

According to a second variant of the invention, the assembly may additionally comprise an intermediate element with high thermal conductivity, which may be considered to be a secondary heat exchanger and which may be metal, in contact with said first sintered joint, allowing a lateral distribution of the thermal flux that may be generated, in a plane that is parallel to the plane of said substrate.

This intermediate element may typically be formed by an assembly of metal tracks mounted on and bonded to the surface of said first joint.

It may also be formed by part of a lead frame.

Figure 4:
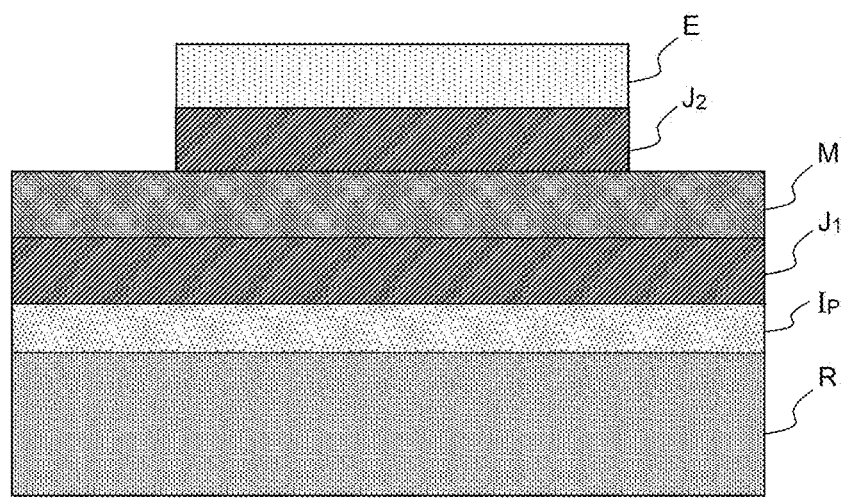
FIG. 4 illustrates a second example of an assembly according to the invention.

Such a configuration is illustrated in FIG. 4 and comprises:

a radiator R;

a thermally conductive and electrically insulating polymer film $I_P$;

a first joint J1;

an intermediate element M with high thermal conductivity, or secondary heat exchanger, which may be metal, in contact with said first sintered joint, allowing a lateral distribution of the thermal flux that may be generated, in a plane that is parallel to the plane of said substrate;

a second joint J2 which may be identical to the first joint J1;

an element E that is capable of giving off heat, which may typically be a semiconductor component (having a metal, preferably Ag or Au, coat) such as a silicon chip in contact with the joint J2 and potentially having, for example, a thermal conductivity that is equal to 100 W·m$^{-1}$ K$^{-1}$.

The same materials and techniques as those of the first variant may be employed in this second variant.

Adhesion promoters may be also used or specific surface treatments (e.g. using argon plasma) may be carried out on the polymer before depositing the paste or the film intended to make the joint J1, in order to improve the adhesion thereof.

The metal of the tracks may be copper, chosen for its good thermal and electrical conductivities. Other metals, alloys or colaminates may also be used. The thicknesses of the tracks may be equal or different and the tracks may be attached to the polymer via the joint J1, either individually, or in the form of a lead frame and cut out afterwards. The dimensions of the metal tracks must be suitable for the target current and must allow the thermal flux to be spread.

The semiconductor component may be mounted and assembled by virtue of the production of the second joint J2. This joint J2 may be produced by sintering nanoparticles, sintering microparticles, soldering, liquid-phase diffusion or any other mounting technique. Silver sintering remains a preferred technique due to its aforementioned good properties.

According to this variant, the thermal interfaces of the stack are reduced to six (and not four as in the first variant) and all of the materials of the assembly are compatible with temperatures of up to 300° C. Multiple thicknesses of insulator and metal may be achieved in one and the same module.

Figure 1:
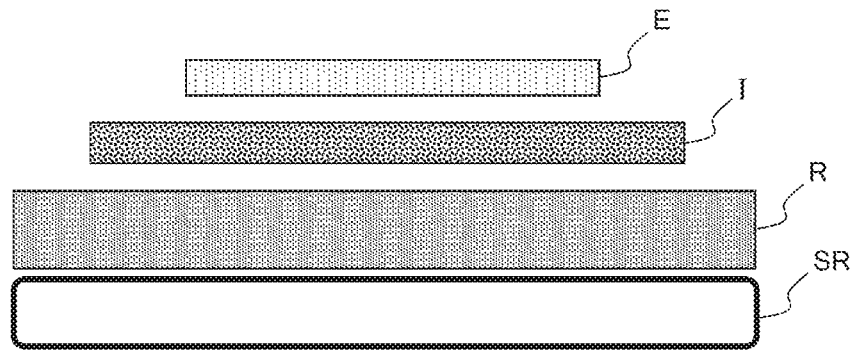
FIG. 1 is a diagram of a power module according to the prior art.
Figure 2:
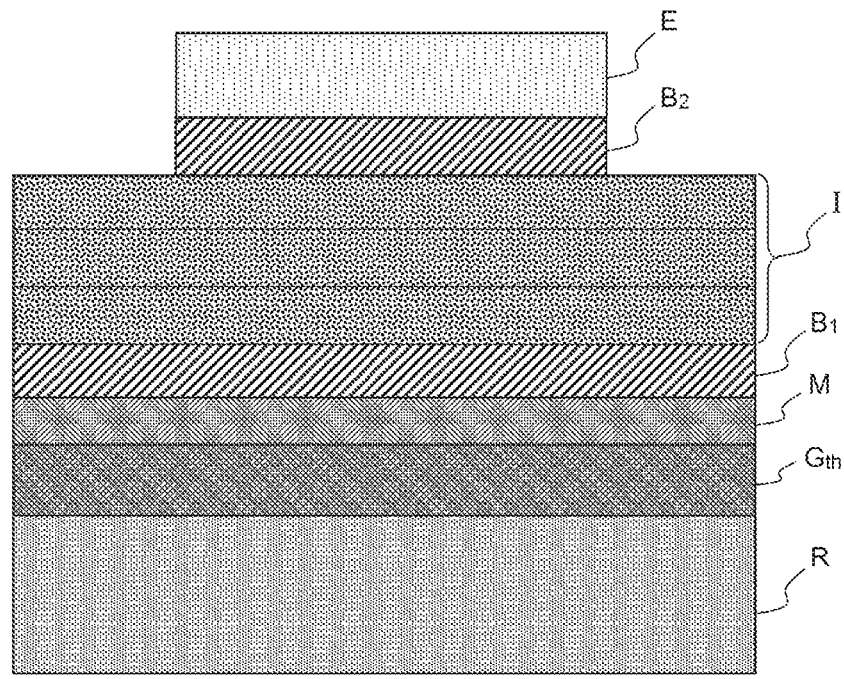
FIG. 2 illustrates an assembly, assembled as conventional, of a semiconductor component on an insulating substrate and a radiator according to the prior art.

It should be noted that thermal simulations show a decrease in the thermal resistance by 55% (stack of FIG. 4) and by 20% (stack of FIG. 3) with respect to the conventional structure shown in FIG. 2. In the case of the stack of FIG. 4, the thermal resistance remains better than that of the conventional structure even if the thickness of the filled polyimide potentially reaches 40 µm. This increase in the thickness of the insulation may be required for high-voltage applications (>2500 V).

Exemplary Method for Manufacturing an Assembly According to the Second Variant of the Invention The steps of manufacturing an exemplary assembly of the invention are presented in FIGS. 5a to 5d.

Figure 5A:
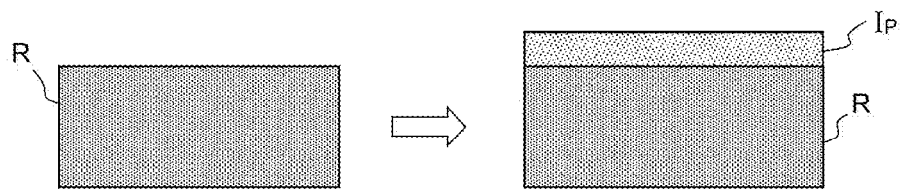
FIGS. 5a to 5d illustrate the main steps of an exemplary method for manufacturing an assembly according to the invention.

Step 1, Illustrated in FIG. 5a:

A layer of polyimide resin $I_P$ corresponding to the polymer film is deposited via screen printing on the main heat sink R, allowing all of the non-planarity and roughness defects of the radiator to be filled in and a planar surface to be achieved.

The resin, which may be polyimide, may advantageously comprise particles in order to improve its thermal conductivity (1 Wm$^{-1}$K$^{-1}$). The thickness of the polyimide may be controlled by the screen-printing stencil (50 µm for example) and is chosen according to the voltage to be held.

It should be noted that various thicknesses of polyimide may be achieved on the same substrate. The resin is subsequently annealed in an oven at 280° C. for one hour. After annealing, a thickness of 20 µm is obtained and allows 2500 V to be held at 300° C.

The conductivity at 300° C. is 10$^{-11}$ (ohm·cm)$^{-1}$ and the permittivity is 2.8 at 1 kHz. This layer of polyimide thus allows the voltages of the electronic components to be insulated from the radiator.

Figure 5B:
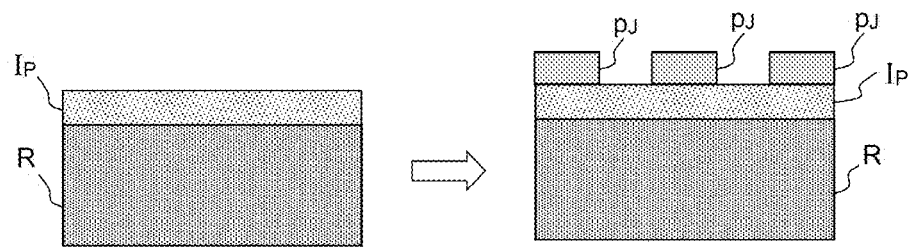

Step 2, Illustrated in FIG. 5b:

A layer of 70 µm of silver paste $p_J$ is subsequently deposited on the polyimide $I_P$ while reproducing the desired design of the conductive tracks (only one paste element is shown).

A drying step allowing the solvent of the paste to evaporate is carried out at 130° C. for 30 minutes.

Figure 5C:
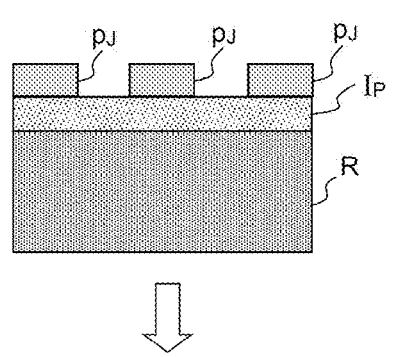
Figure 5C:
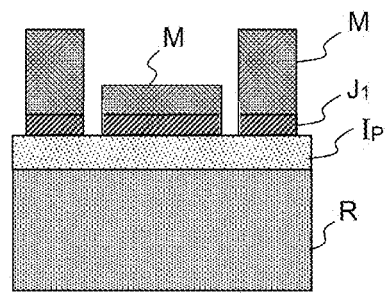

Step 3, Illustrated in FIG. 5c:

The metal tracks M are subsequently mounted, individually or in the form of a network of conductors commonly called a lead frame, on the joints J1 (it should be noted that in the case of production of the structure shown in FIG. 3, the semiconductor element E is placed on the paste intended for the joint, instead of being placed on the metal tracks). The thicknesses of the conductors or conductive tracks may be the same or different, and the conductors or conductive tracks may for example be made of copper. An Ni/Au coat over the copper is preferable, in order to improve the mechanical adhesion of the sintered joint with the metal.

A sintering cycle is subsequently carried out in order to attach the tracks to the polyimide (in the case of producing the structure shown in FIG. 3, the sintering cycle allows the semiconductor to be attached).

The thickness of the sintered joint J1 thus obtained is about 20 µm. The effect of sintering parameters on the adhesion of the tracks to the polyimide has been studied. For sintering pressures that are less than or equal to 6 MPa, the interface between the sintered silver joint and the polyimide constitutes the weak point, with shear stiffnesses of the order of 100 N for an area of 25 mm$^2$ and a sintering temperature of 280° C. This value may be improved to 160 N by increasing the sintering temperature (320° C.). For pressures that are greater than 9 MPa, the interface between the polyimide and the heat exchanger becomes the weakest point, with shear strengths of the order of 210 N (for an area of 25 mm$^2$).

Figure 5D:
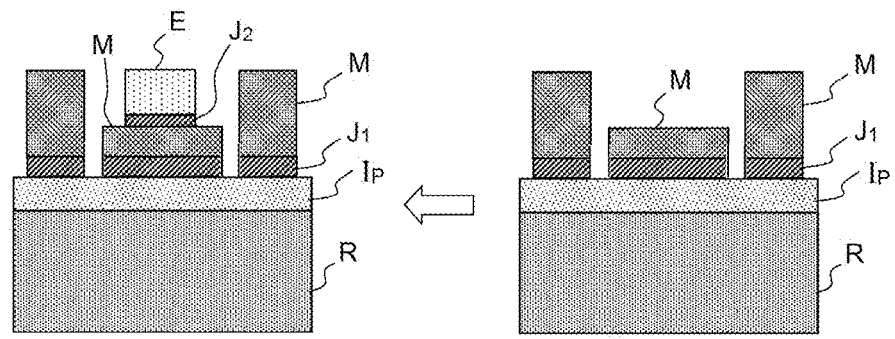

Step 4, Illustrated in FIG. 5d:

The semiconductor element E may subsequently be mounted on the conductive tracks M, which may be made of copper, via a second joint J2 that is obtained by soldering or sintering silver, in particular, or another chip-mounting technology.

Exemplary Method for Manufacturing an Assembly According to a Third Variant of the Invention According to this variant of the invention, metal tracks are produced via a discontinuous sintered metal joint that is connected, via a second sintered metal joint, to the semiconductor element E.

Figure 6A:
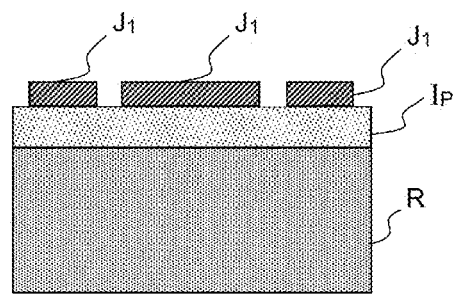
FIGS. 6a and 6b illustrate the steps of a second exemplary method for manufacturing an assembly according to the invention.

More specifically, as illustrated in FIG. 6a, a first discontinuous sintered metal joint J1, serving as metal tracks, is produced on the surface of the film Ip that is in contact with the radiator R (according to the techniques described above). For this purpose, an intermediate part may be used, which part is not bonded to the joint and allows a sintering operation to produce the first joint from a sintering paste.

Figure 6B:
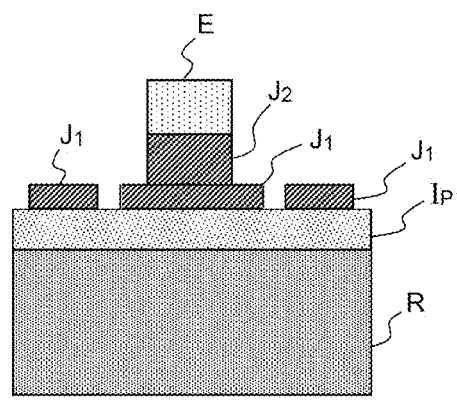

A second sintering paste is subsequently deposited in order to produce, via sintering, a second sintered metal joint J2 allowing the semiconductor element E to be securely fixed in place, as shown in FIG. 6b.

Figure 7:
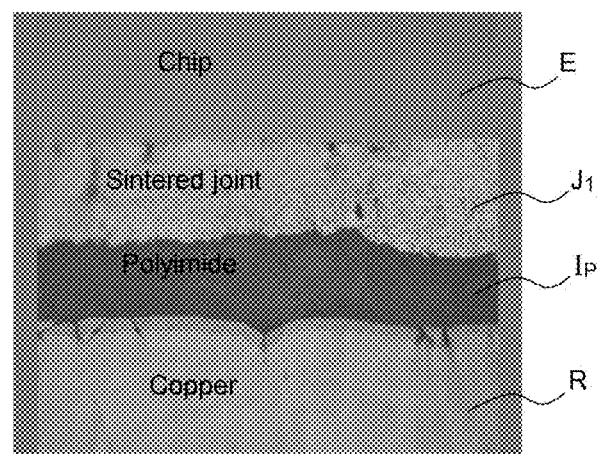
FIG. 7 illustrates a micrograph of an assembly assembled according to the invention.

FIG. 7 illustrates a micrograph of an assembly according to the first variant of the invention described above and comprising the assembly: copper (main heat exchanger R)/polyimide (film I$_P$/sintering Ag (joint J1)/semiconductor (element E).

The thicknesses of the polyimide P and the first joint J1 are about 20 μm.

According to a fourth variant of the invention, the assembly may comprise, as a radiator or main heat exchanger, a thick metal structure and, as an element that is capable of transmitting heat, another thick metal structure.

Figure 8A:
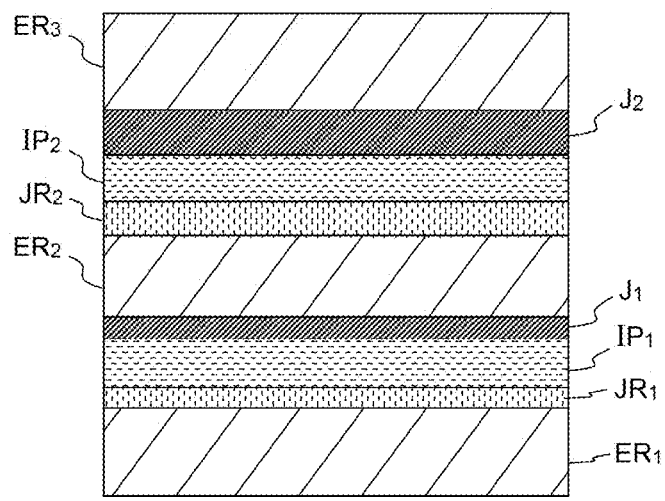
FIGS. 8a and 8b illustrate two examples of a fourth variant of an assembly according to the invention comprising thick metal structures, sintered metal joints and polymer films.
Figure 8B:
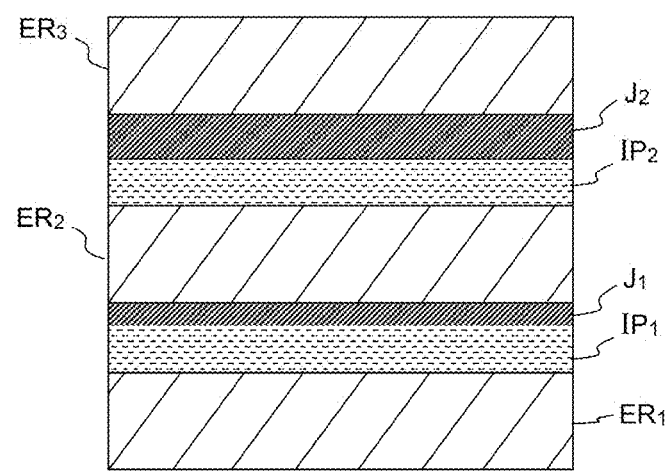

The thick structures are connected to said polymer film via sintered metal joints. It should be noted that in the case of using a polymer resin, the latter may be directly deposited on the surface of a thick metal structure, while in the case of using a dry polymer film, the connection is made via a sintered metal joint. FIGS. 8a and 8b illustrate an example of an assembly using resin-based films and an example of an assembly using dry films, respectively.

In this variant, the radiators or heat exchangers and element that are capable of transmitting heat are thick metal structures ER$_1$, ER$_2$, ER$_3$ (only three structures are shown, but a larger number could be employed).

According to the example shown in FIG. 8a, the polymer films I$_{P1}$, I$_{P2}$ are mounted dry films requiring the use of sintered joints J$_{R1}$, J$_{R2}$. The polymer films are themselves securely fastened to the top thick structures via sintered metal joints J$_1$, J$_2$.

According to the example shown in FIG. 8b, the polymer films I$_{P1}$, I$_{P2}$ may be obtained from polymer resin, requiring no use of sintered joints (absence of sintered joints equivalent to the joints J$_{R1}$, J$_{R2}$). The polymer films are themselves securely fastened to the top thick structures via sintered metal joints J$_1$, J$_2$.

The invention claimed is:

1. An assembly comprising:
   at least one element that is capable of transmitting heat;
   at least one electrically insulating substrate comprising at least one film of a polymer that is a good thermal conductor and electrical insulator;
   at least one sintered metal joint that is in direct contact with said polymer film; and
   a main radiator; said main radiator being in direct contact, or in contact via any of the sintered joint and another sintered joint, with said substrate.

2. The assembly according to claim 1, wherein the element that is capable of transmitting heat is a semiconductor component.

3. The assembly according to claim 2, wherein the element that is capable of transmitting heat is a silicon chip.

4. The assembly according to claim 1, wherein the element that is capable of transmitting heat is a thick metal structure whose thickness may typically be greater than about several tens of microns.

5. The assembly according to claim 1, wherein said sintered joint is discontinuous.

6. The assembly according to claim 5, comprising metal tracks that are at least partly formed by said sintered joint, the element that is capable of transmitting heat being connected to said discontinuous sintered joint via the another sintered joint.

7. The assembly according to claim 1, comprising an intermediate element with high thermal conductivity (M), which may be metal, in contact with said joint, allowing a lateral distribution of the thermal flux that may be generated, in a plane that is parallel to the plane of said substrate.

8. The assembly according to claim 7, wherein the intermediate element with high thermal conductivity is inserted between a first joint and a second joint, said second joint being in contact with said element that is capable of giving off heat.

9. The assembly according to claim 7, wherein said intermediate element comprises a set of metal tracks.

10. The assembly according to claim 7, wherein said intermediate element is an element belonging to a lead frame.

11. The assembly according to claim 1, wherein the first and/or second joints are metal joints that may be made of silver.

12. The assembly according to claim 1, wherein the thermally conductive and electrically insulating polymer is a polyimide, a polyamide or a polyimide-imide.

13. The assembly according to claim 1, wherein the thermally conductive and electrically insulating polymer is filled with particles that may be dielectric particles (made of alumina or boron nitride) or metal particles.

14. The assembly according to claim 1, comprising at least one thermally conductive and electrically insulating polymer film on the surface of said radiator or on the surface of said sintered joint.

15. The assembly according to claim 1, wherein the element that is capable of transmitting heat is a thick metal structure, the radiator being a thick metal structure, said metal structures potentially having thicknesses that are typically greater than about several tens of microns.

16. The assembly according to claim 15, comprising a stack comprising:
   at least a first thick metal structure;
   at least a first sintered joint;
   at least one polymer film;
   at least a second sintered joint;
   at least a second thick metal structure.

17. The assembly according to claim 1, wherein the radiator is a thick structure that may be made of copper, aluminum or AlSiC, the thickness of said thick structure typically potentially being greater than about 500 µm.

18. A method for manufacturing an assembly comprising:
an element that is capable of transmitting heat;
an electrically insulating substrate comprising at least one film of a polymer that is a good thermal conductor and electrical insulator;
at least one main radiator;
said main radiator being in direct contact, or in contact via a sintered joint, with said substrate,
said method comprising the production of a sintered metal joint in direct contact with said film of a polymer that is a good thermal conductor and electrical insulator.

19. The manufacturing method according to claim 18, comprising the production of said sintered metal joint between a thermally conductive and electrically insulating dry polymer film and said radiator.

20. A fabrication method according to claim 18, comprising
the deposition of a thermally conductive and electrically insulating polymer resin on the surface of said radiator, followed by a step of drying said resin.

21. The manufacturing method according to claim 18, comprising the following steps:
the deposition of at least a first paste or a first dry film of metal micro- or nanoparticles, which paste or dry film is intended to form a metal joint on the surface of said film of a polymer that is a good thermal conductor and electrical insulator;
the deposition of said element that is capable of transmitting heat on top of said first paste or said first dry film of metal micro- or nanoparticles;
a sintering operation so as to form a first sintered joint making the connection between said element that is capable of transmitting heat and said substrate.

22. The method for manufacturing an assembly according to claim 21; wherein the deposition of the first paste is carried out via screen printing.

23. The method for manufacturing an assembly according to claim 20, further comprising:
introduction of an intermediate element with high thermal conductivity onto the surface of said first paste or said first film;
production of a second joint between said intermediate element and said element that is capable of giving off heat.

24. The method for manufacturing an assembly according to claim 23, further comprising:
deposition of a second paste or a second dry film of metal micro- or nanoparticles on the surface of said intermediate element, which paste or dry film is intended to form a second joint;
deposition of said element that is capable of giving off heat on the surface of said second paste or said dry film;
or more sintering operation(s) so as to form a first sintered joint and a second sintered joint making the connection between said element that is capable of giving off heat and said substrate.

25. The method for manufacturing an assembly according to claim 23; wherein the introduction of an intermediate element with high thermal conductivity to the surface of said first paste or said first dry film of metal micro- or nanoparticles, wherein metal tracks are attached to said thermally conductive and electrically insulating polymer film, on top of said first paste or said first dry film of metal micro- or nanoparticles.

26. The method for manufacturing an assembly according to claim 23, further comprising a step of mounting of a lead frame comprising said intermediate element with high thermal conductivity on the surface of said first paste or said first dry film of metal micro- or nanoparticles allowing the introduction of said intermediate element with high thermal conductivity.

27. The method for manufacturing an assembly according to claim 24, comprising a step of drying said first paste or said first paste and said second paste before the sintering operation.

28. The manufacturing method according to claim 25, comprising production of the metal tracks that are at least partly formed by said sintered joint being discontinuous, the element that is capable of transmitting heat being connected to said discontinuous sintered joint via another sintered joint.

* * * * *

UNITED STATES PATENT AND TRADEMARK OFFICE
CERTIFICATE OF CORRECTION

PATENT NO. : 9,865,530 B2
APPLICATION NO. : 15/205290
DATED : January 9, 2018
INVENTOR(S) : Rabih Khazaka Page 1 of 1

It is certified that error appears in the above-identified patent and that said Letters Patent is hereby corrected as shown below:

In the Claims

In Line 45, Column 10 in Claim 12, "a polyimide, a polyamide or a polyimide-imide" should be --a polyimide, a polyamide or a polyamide-imide--.

Signed and Sealed this
Twentieth Day of February, 2018

Andrei Iancu
*Director of the United States Patent and Trademark Office*